(12) United States Patent
Herrmann et al.

(10) Patent No.: US 9,568,523 B2
(45) Date of Patent: Feb. 14, 2017

(54) VARIABLE RESISTOR ARRANGEMENT, MEASUREMENT BRIDGE CIRCUIT AND METHOD FOR CALIBRATING A MEASUREMENT BRIDGE CIRCUIT

(75) Inventors: Ingo Herrmann, Friolzheim (DE); Roland Mueller-Fiedler, Leonberg (DE); Veronique Krueger, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 281 days.

(21) Appl. No.: 14/353,758

(22) PCT Filed: Sep. 6, 2012

(86) PCT No.: PCT/EP2012/067374
§ 371 (c)(1),
(2), (4) Date: Aug. 6, 2014

(87) PCT Pub. No.: WO2013/064294
PCT Pub. Date: May 10, 2013

(65) Prior Publication Data
US 2014/0347072 A1 Nov. 27, 2014

(30) Foreign Application Priority Data
Nov. 2, 2011 (DE) .......................... 10 2011 085 555

(51) Int. Cl.
*G01R 27/02* (2006.01)
*G01R 35/00* (2006.01)
(Continued)

(52) U.S. Cl.
CPC .............. *G01R 27/02* (2013.01); *G01R 17/10* (2013.01); *G01R 35/005* (2013.01); *H01C 10/16* (2013.01)

(58) Field of Classification Search
CPC .............. G01D 5/16; G01D 5/12; G01D 5/14; G11B 5/455; G11B 20/1816; G11C 11/16; G11C 13/003; G11C 2213/56; G11C 2213/76; H01L 27/224; H01L 43/08; B82Y 10/00; G01R 1/203; G01R 17/105; G01R 19/0023; G01R 27/00; G01R 27/02; G01R 27/025; G01R 27/08; G01R 27/14; G01R 31/3274; G01R 31/3278; G01R 35/005; G01R 35/007; G01R 35/00; G01R 27/28; G01R 31/3191; G01R 21/00; G01R 33/3415; G01R 33/3657; G01R 33/3664; G01R 33/09; G01R 27/18; G01R 33/098; G01P 3/487
(Continued)

(56) References Cited

U.S. PATENT DOCUMENTS 4,006,430 A 2/1977 Meyer-Ebrecht
5,355,129 A 10/1994 Baumann
(Continued)

FOREIGN PATENT DOCUMENTS

CN 1465981 A 1/2004
DE 22 14 603 9/1972
(Continued)

OTHER PUBLICATIONS

Nonlinear Circuit Foundations for Nanodevices, Part I: The Four-Element Torus; Proceedings of the IEEE; Nov. 2003; pp. 1830-1859; vol. 91, Issue No. 11, New York, USA), hereinafter 'Chua'.*
(Continued)

*Primary Examiner* — Alesa Allgood
(74) *Attorney, Agent, or Firm* — Maginot, Moore & Beck LLP

(57) ABSTRACT

A measurement bridge circuit includes a first branch and a second branch. The first branch contains a first resistor
(Continued)

which is sensitive to measured variables and an invariable resistor connected in series. A first tap point is located between the first resistor and the invariable resistor. The second branch contains a second resistor which is sensitive to measured variables and a variable resistor arrangement connected in series. The variable resistor arrangement includes a first component having an invariable electrical resistance value and a second component having a variable electrical resistance value. The second component is connected in parallel with the first component in order to vary a total electrical resistance value for the variable resistor arrangement. A second tap point is located between the second resistor and the variable resistor arrangement.

8 Claims, 1 Drawing Sheet

(51) Int. Cl.
  *G01R 17/10* (2006.01)
  *H01C 10/16* (2006.01)
(58) Field of Classification Search
  USPC .......... 324/421, 207.21, 222, 223, 525, 549, 324/691, 601, 210–212, 706, 610
  See application file for complete search history.

(56) References Cited

U.S. PATENT DOCUMENTS

| | | | |
|---|---|---|---|
| 5,485,100 A | 1/1996 | Kogut | |
| 2009/0207064 A1 | 8/2009 | Feldotte et al. | |
| 2010/0109656 A1* | 5/2010 | Wang | G01R 33/098 |
| | | | 324/210 |
| 2011/0002156 A1* | 1/2011 | Murooka | G11C 8/08 |
| | | | 365/148 |
| 2012/0011091 A1* | 1/2012 | Aparin | G06N 3/049 |
| | | | 706/33 |
| 2012/0127780 A1* | 5/2012 | Strachan | G11C 13/0007 |
| | | | 365/148 |

FOREIGN PATENT DOCUMENTS

| | | |
|---|---|---|
| DE | 40 24 402 C1 | 10/1991 |
| DE | 41 15 288 A1 | 11/1992 |
| DE | 103 08 209 B3 | 10/2004 |
| EP | 0 264 388 B1 | 4/1988 |
| JP | 2007-184065 * | 7/2007 ............ G11C 11/15 |

OTHER PUBLICATIONS

International Search Report corresponding to PCT Application No. PCT/EP2012/067374, mailed Dec. 21, 2012 (German and English language document) (9 pages).

Pershin et al.; Practical Approach to Programmable Analog Circuits With Memristors; IEEE Transactions on Circuits and Systems; Aug. 2010; pp. 1857-1864; vol. 57, Issue No. 8; USA.

Chua; Nonlinear Circuit Foundations for Nanodevices, Part I: The Four-Element Torus; Proceedings of the IEEE; Nov. 2003; pp. 1830-1859; vol. 91, Issue No. 11; New York, USA.

Shin et al.; Memristor Applications for Programmable Analog ICs; IEEE Transactions on Nanotechnology; Mar. 2011; pp. 266-274; vol. 10, Issue No. 2; Piscataway, New Jersey, USA.

Shin et al.; Memristor-Based Fine Resolution Programmable Resistance and Its Applications; IEEE International Conference on Communications, Circuits and Systems; pp. 948-951; Jul. 23, 2009; Piscataway, New Jersey, USA.

* cited by examiner

VARIABLE RESISTOR ARRANGEMENT, MEASUREMENT BRIDGE CIRCUIT AND METHOD FOR CALIBRATING A MEASUREMENT BRIDGE CIRCUIT

This application is a 35 U.S.C. §371 National Stage Application of PCT/EP2012/067374, filed on Sept. 6, 2012, which claims the benefit of priority to Serial No. DE 10 2011 085 555.6, filed on Nov. 2, 2011 in Germany, the disclosures of which are incorporated herein by reference in their entirety.

BACKGROUND

The present disclosure relates to a variable resistor arrangement, to a measurement bridge circuit, to a method for calibrating a measurement bridge circuit and to a corresponding control device and computer program product.

In a circuit which is based on the electrical equilibrium in two strings, for example, the possibility of adjusting the resistance of at least one of the strings is necessary owing to component tolerances and manufacturing tolerances. For example, individual resistances of a cascaded arrangement of resistors can be bridged or short-circuited by means of irreversible adjustment methods, such as laser trimming or zener zapping, in order to match a resultant resistance of the arrangement. In the event of a disturbance to the equilibrium, for example owing to component aging in the strings, renewed adjustment is necessary. For this purpose, the cascaded arrangement can be replaced and adjusted.

A device for adjusting sensor signals is known from DE 4 115 288 A1.

SUMMARY

Against this background, the present disclosure proposes a variable resistor arrangement, a measurement bridge circuit, a method for calibrating a measurement bridge circuit and finally a corresponding control device and a computer program product.

The disclosure is based on the knowledge that a memristor can store a written electrical resistance value as long as the memristor is operated above a limit frequency and/or below a limit current intensity. The electrical resistance value can be increased or reduced if a current below the limit frequency and/or above the limit current intensity is supplied to the memristor. A circuit comprising a memristor can be operated for calibrating the circuit below the limit frequency and/or above the limit current intensity. The circuit comprising the memristor can, during operation, be operated above the limit frequency and/or below the limit current intensity and the calibration is maintained.

Advantageously, a single memristor which occupies a small area can replace a large number of individual components which are generally kept available for calibration and occupy a large area. As a result, a circuit comprising the memristor can be smaller. Since the memristor can be calibrated again and again, the circuit can be fixedly installed since no replacement of the circuit is necessary. Owing to the lower number of parts, the circuit can also be provided in a cost-effective manner.

The present disclosure provides a variable resistor arrangement comprising the following features:
a first component with an invariable electrical resistance value; and
a memristor with a variable electrical resistance value, which memristor is connected in parallel with the first component in order to vary a total electrical resistance value of the resistor arrangement.

Furthermore, the present disclosure provides a measurement bridge circuit, comprising the following features:
a first branch, which has a first resistor connected in series and an invariable resistor, wherein a first tap point is arranged between the first resistor and the invariable resistor; and
a second branch, which has a second resistor connected in series and a variable resistor arrangement in accordance with the approach proposed here, wherein a second tap point is arranged between the second resistor and the resistor arrangement, wherein the first branch and the second branch are connected in parallel and a measuring instrument can be arranged between the first tap point and the second tap point.

Furthermore, the present disclosure provides a method for calibrating a measurement bridge circuit in accordance with the approach proposed here, wherein the method comprises the following steps:
determining a measured value of the measuring instrument when the first resistor is subjected to a physical calibration variable and the second resistor is likewise subjected to a physical calibration variable; and
varying the electrical resistance value of the memristor of the variable resistor arrangement until the measured value is in a tolerance range by a predetermined value in order to calibrate the measurement bridge circuit.

A component with an invariable electrical resistance value can be understood to mean a resistor which retains the same resistance within a tolerance range over its entire life. A memristor can be understood to mean a component with a variable electrical resistance value. A total electrical resistance of a parallel circuit can be understood to mean a reciprocal of a sum of a reciprocal of the resistance value of the first component and a reciprocal of the resistance value of the memristor or the second component. The first component and the second component can be individual discrete components. A measurement bridge circuit can have a first connection point for a feed voltage and a second connection point for the feed voltage. The first branch can be electrically connected to the second branch at the connection points. A tap point can be a connection point. A measuring instrument can be an ammeter or a voltmeter. A physical calibration variable can be understood to mean, for example, a predetermined force. For example, the calibration variable can be defined such that there is no external effect acting on the resistor. The calibration variables can be the same. In order to vary the electrical resistance value, for example, a rectified current or a rectified voltage can be applied to the memristor. By impressing a rectified component onto the memristor, charge carriers in the memristor can experience a change in location, which can increase or reduce an electrical resistance of the memristor. The rectified component can have a minimum variable and/or a minimum duration.

The first resistor and/or the second resistor can be a resistor which is sensitive to measured variables and can be designed to map a change in a physical variable at the sensor in a corresponding change in an electrical resistance value. For example, a resistor which is sensitive to measured variables can be a piezoresistive pressure sensor or a length sensor.

The first resistor which is sensitive to measured variables can be connected upstream of the invariable resistor. The variable resistor arrangement can be connected upstream of the second resistor which is sensitive to measured variables.

By virtue of this arrangement, a half-bridge circuit can be realized. The circuit can also be constructed in the form of a quarter-bridge with only one resistor which is sensitive to measured variables.

The variable resistor arrangement can have at least one externally accessible calibration connection. The memristor can be energized directly via a calibration connection. As a result, an effect of the other components on the calibration operation can be minimized.

A voltage measuring device can be arranged between the first tap point and the second tap point. A constant current can be supplied to the measurement bridge circuit. A variation at the resistors sensitive to measured variables can be mapped by a change in a voltage value at the voltage measuring device.

In the varying step, the resistance value can be increased continuously in one direction until the measured value departs from the tolerance range. An interval of the resistance value between the measured value entering the tolerance range and the measured value departing from the tolerance range can be determined. The resistance value can then be decreased continuously by a predetermined proportion, in particular half, of the interval. Alternatively, in the varying step, the resistance value can be reduced continuously until the measured value departs from the tolerance range. An interval of the resistance value between the measured value entering the tolerance range and the measured value departing from the tolerance range can be determined. The resistance value can then be increased continuously by a predetermined proportion, in particular half, of the interval in order to calibrate the measurement bridge circuit. By virtue of detecting a first value of the resistance on entering the tolerance range and a second value of the resistance when departing from the tolerance range, a resistance band is provided, with it being possible for the resistance value to be set in the middle of this resistance band in order to match the measurement bridge. An interval can represent a width of the resistance band. The resistance value can be increased, for example, until the tolerance range is left. Then, the resistance value can be reduced again until the predetermined proportion of the interval is reached.

The present disclosure furthermore provides a control device which is designed to implement or apply the steps of the method according to the disclosure in corresponding devices. Also by virtue of this variant embodiment of the disclosure in the form of a control device, the object on which the disclosure is based can be achieved quickly and efficiently.

A control device can in this case be understood to mean an electrical device which processes sensor signals and outputs control signals in dependence thereon. The control device can have an interface, which can be hardware-based and/or software-based. In the case of a hardware-based design, the interfaces can be, for example, part of a so-called system ASIC, which contains a wide variety of functions of the control device. However, it is also possible for the interfaces to be dedicated integrated circuits or consist at least partially of discrete components. In the case of a software-based design, the interfaces can be software modules which are provided, for example, on a microcontroller in addition to other software modules.

Also advantageous is a computer program product with program code which can be stored on a machine-readable storage medium such as a semiconductor memory, a hard disk drive or an optical storage medium and is used for implementing the method in accordance with one of the above-described embodiments, wherein the program is run on a computer or an apparatus.

BRIEF DESCRIPTION OF THE DRAWINGS

The disclosure will be explained in more detail by way of example below with reference to the attached drawings, in which.

DETAILED DESCRIPTION

In the description below relating to preferred exemplary embodiments of the present disclosure, functionally similar elements illustrated in the various figures have been provided with the same or similar reference symbols, wherein repeated description of these elements has not been provided.

Figure 1:
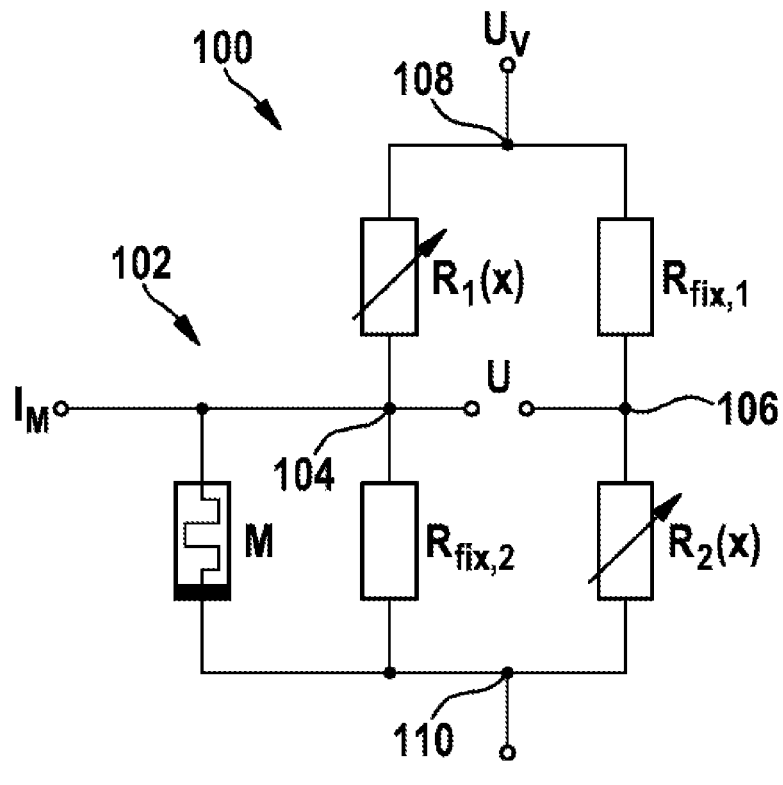
FIG. 1 shows a block circuit diagram of a measurement bridge circuit comprising a variable resistor arrangement in accordance with an exemplary embodiment of the present disclosure.

FIG. 1 shows a block circuit diagram of a measurement bridge circuit 100 comprising a variable resistor arrangement 102 in accordance with an exemplary embodiment of the present disclosure. The measurement bridge circuit 100 has two branches. In one of the branches, a first resistor $R_1(x)$ which is sensitive to measured variables and the variable resistor arrangement 102 are connected in series. A first tap point 104 is arranged between the two. A second resistor $R_2(x)$ which is sensitive to measured variables and a first invariable resistor $R_{fix},1$ are connected in series in the other of the branches. A second tap point 106 is arranged between the two. The two branches are connected in parallel with one another between a first connection 108 and a second connection 110. The variable resistor arrangement 102 has a second invariable resistor $R_{fix},2$ and a memristor M connected in parallel therewith.

During operation, the measurement bridge circuit 100 is supplied by means of a supply voltage $U_v$ first between the first connection 108 and the second connection 110 by the two branches of the measurement bridge circuit 100. The second connection 110 can be connected to a zero potential GND. If the two branches are in equilibrium with respect to one another, no current flows between the first tap point 104 and the second tap point 106 and no voltage U is present. If the measurement bridge circuit 100 is detuned, for example, owing to a drift of one of the resistors $R_1(x)$, $R_2(x)$ which are sensitive to measured variables although the two resistors $R_1(x)$, $R_2(x)$ which are sensitive to measured variables are unloaded, calibration of the measurement bridge circuit 100 is necessary in order to suppress the current flow between the tap points 104, 106. In order to calibrate the measurement bridge circuit 100, the variable resistor arrangement 102 is varied until the equilibrium is produced again. In order to vary a resistance value of the memristor M, a memristor current $I_M$ is applied from a memristor terminal to the second connection 110 through the memristor M. The memristor current $I_M$ can have a high DC component. Owing to the memristor current $I_M$, charge carriers within the memristor M are moved, as a result of which a conductivity, i.e. the resistance value of the memristor M, is changed.

While the measurement bridge circuit 100 is operated on a voltage $U_v$ with a carrier frequency which is higher than a limit frequency of the memristor M, the resistance value of the memristor M does not change. Then, an amplitude-modulated signal U can be tapped off between the tap points 104, 106, said signal mapping a measured variable at the resistors $R_1(x)$, $R_2(x)$ which are sensitive to measured variables.

Figure 2:
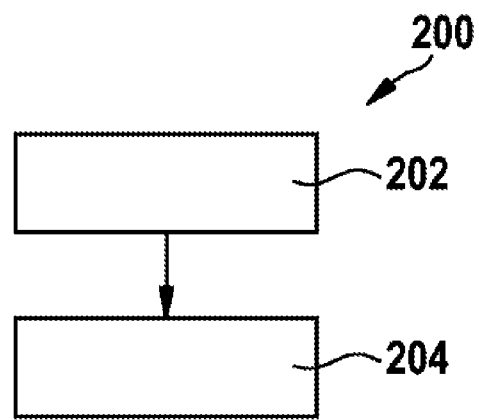
FIG. 2 shows a flow chart of a method for calibrating a measurement bridge circuit in accordance with an exemplary embodiment of the present disclosure.

FIG. 2 shows a flow chart of a method 200 for calibrating a measurement bridge circuit in accordance with an exemplary embodiment of the present disclosure. The method 200 has a determining step 202 and a varying step 204. In the determining step 202, a measured value of the measuring instrument is determined when the first resistor which is sensitive to measured variables is subjected to a physical calibration variable and the second resistor which is sensitive to measured variables is likewise subjected to a physical calibration variable. In particular, the calibration variables can be identical or equal in magnitude but with opposite mathematical signs. For example, the resistors sensitive to measured variables can be subjected only to their own weight or to a base load. In the varying step 204, the electrical resistance value of the second component of the variable resistor arrangement (the memristor) is varied until the measured value is within a tolerance range about a predetermined value. For example, the predetermined value can be a predetermined voltage level, such as zero volt. The tolerance range can be fixed, for example, taking into consideration a measurement inaccuracy.

In other words, a memristor M can replace a resistor network for adjusting sensors $R_1(x)$, $R_2(x)$. Such a resistor network can be set to the desired value at the adjustment time by means of laser trimming or zener zapping, for example.

The principle of the memristor M can best be described theoretically in comparison with the other passive components. All of the components are based on coupling of the electrical charge and its derivation (current) on one side and the magnetic flux and its derivation (voltage) on the other side. On this basis, an electrical resistor corresponds to a derivation of the voltage according to the current, an inductance corresponds to a derivation of the flux according to the current, a (reciprocal) capacitance corresponds to a derivation of the voltage according to the charge and a memristivity corresponds to a derivation of the flux according to the charge.

In a microsystem-based implementation of a memristor, very thin (a few nm) titanium dioxide layers are applied between platinum electrodes. If a section of the $TiO_2$ layer is doped with oxygen imperfections, a high electrical conductivity is set in this section, while the undoped section is an insulator. By applying an electrical field, i.e. voltage, the partition line between the regions can be moved and thus the total resistance of the layer can be changed. In the process, however, not only the level of the field is decisive, but also the history of the field profile (similarly to the stored charge being dependent on the history of energization in the case of a capacitor). The rate of the change in field also plays a significant role. The response is therefore very frequency-dependent (as is also the case for inductances and capacitances). This can be utilized in order to use memristors as nonvolatile analog storage media. The resistance of a memristor can be set (described) by low frequencies and high fields, while reading takes place at low high-frequency voltages which do not change the state of the memristor since the time integral of the current remains constant.

Zener zapping cascades or trimming resistor networks which take up a comparatively large amount of space can be avoided by means of a memristor. The space requirement increases the more precise the adjustment value is intended to be set and the larger an adjustment range is since each part of the cascade or of the network merely represents a binary value. A value set using zener zapping cascades or trimming resistor networks can only be corrected with limitations; retrospective renewed adjustment in order to correct the drift of a sensor over life in the factory, for example, is usually only possible in one direction (cf. haircutting). With a memristor as adjustment element, an analog adjustment value which can be corrected retrospectively if required can be stored with a single or a few components with a low space requirement. By virtue of a memristor in a sensor arrangement as is proposed here, an adjustment value can be stored in analog form instead of in digital form with a reduced space requirement and the adjustment value can retrospectively be varied without any limitation.

FIG. 1 shows, by way of example, a sensor arrangement whose signal is mapped in an electrical value with the aid of a Wheatstone bridge 100 comprising two variable resistors R(x). The variable resistors (for example piezoresistive resistors on a pressure sensor membrane) are interconnected with two fixed resistors ($R_{fix}$). For technological reasons, generally detuning of the bridge 100 occurs, which can conventionally be corrected by virtue of the fact that one of the fixed resistors is constructed as a network comprising a plurality of resistors which can be deactivated individually, for example by laser trimming. As a result, the detuning of the bridge 100 can be compensated for to a large extent, but only once. If, as shown in FIG. 1, a combination 102 of a normal resistor ($R_{fix}$,2) and a memristor (M) is used instead of the trimming resistor network, the memristor can be described at the adjustment time via an additional terminal. This enables tuning of the bridge 100 in a manner which is almost as accurate as desired. For the case where the sensors have a drift over life, it is thus also possible, for example in a factory, for the sensor arrangement to be adjusted again, whereas it would be necessary to replace a sensor with conventional adjustment. One use of the memristor adjustment is in principle possible in all sensors in which adjustment is necessary after production and which do not have internal evaluation logic. This adjustment is possible in this case without any additional complexity being involved.

The exemplary embodiments described and shown in the figures are only selected by way of example. Different exemplary embodiments can be combined with one another in their entirety or in relation to individual features. An exemplary embodiment can also be supplemented by features of a further exemplary embodiment.

In addition, method steps according to the disclosure can be implemented repeatedly and in a sequence which is other than that described.

The invention claimed is:

1. A measurement bridge circuit, comprising:
   a first branch including a first resistor connected in series with an invariable resistor;
   a first tap point located between the first resistor and the invariable resistor;
   a second branch including a second resistor connected in series with a variable resistor arrangement having (i) a first component with an invariable electrical resistance value, and (ii) a memristor with a variable electrical resistance value, the memristor connected in parallel with the first component and configured to vary a total electrical resistance value of the variable resistor arrangement; and
   a second tap point located between the second resistor and the variable resistor arrangement, wherein the first branch and the second branch are connected in parallel and a measuring instrument is configured to be arranged between the first tap point and the second tap point.

2. The measurement bridge circuit as claimed in claim 1, wherein at least one of the first resistor and the second resistor is a resistor which is sensitive to measured variables and is configured to map a change in a physical variable at a sensor in a corresponding change in an electrical resistance value.

3. The measurement bridge circuit as claimed in claim 1, wherein the variable resistor arrangement includes at least one externally accessible calibration connection.

4. The measurement bridge circuit as claimed in claim 1, wherein the measuring instrument at least includes a voltage measuring device connected between the first tap point and the second tap point and configured to measure a voltage between the first tap point and the second tap point.

5. A method for calibrating a measurement bridge circuit including a first branch and a second branch, comprising:
determining a measured value of a measuring instrument when a first resistor of the first branch is subjected to a physical calibration variable and a second resistor of the second branch is likewise subjected to a physical calibration variable; and
varying the electrical resistance value of a memristor of a variable resistor arrangement until the measured value is in a tolerance range by a predetermined value in order to calibrate the measurement bridge circuit,
wherein the first branch includes the first resistor connected in series with an invariable resistor,
wherein a first tap point of the measurement bridge circuit is located between the first resistor and the invariable resistor,
wherein the second branch includes the second resistor connected in series with the variable resistor arrangement,
wherein the variable resistor arrangement includes a first component with an invariable electrical resistance value and the memristor,
wherein the memristor has a variable electrical resistance value and is connected in parallel with the first component and configured to vary a total electrical resistance value of the variable resistor arrangement,
wherein a second tap point of the measurement bridge circuit is located between the second resistor and the variable resistor arrangement, and
wherein the first branch and the second branch are connected in parallel and the measuring instrument is configured to be arranged between the first tap point and the second tap point.

6. The method as claimed in claim 5, wherein at least one of:
in varying the electrical resistance value, the electrical resistance value is increased continuously until the measured value departs from the tolerance range, and an interval of the electrical resistance value between the measured value entering the tolerance range and the measured value departing from the tolerance range is determined, the electrical resistance value is then decreased continuously by a predetermined proportion of the interval, the predetermined proportion being half of the interval; and
in varying the electrical resistance value, the electrical resistance value is decreased continuously until the measured value departs from the tolerance range and the interval of the electrical resistance value between the measured value entering the tolerance range and the measured value departing from the tolerance range is determined, the electrical resistance value is then increased continuously by a predetermined proportion in order to calibrate the measurement bridge circuit.

7. A control device for calibrating a measurement bridge circuit including a first branch and a second branch, the control device being configured to:
determine a measured value of a measuring instrument when a first resistor of the first branch is subjected to a physical calibration variable and a second resistor of the second branch is likewise subjected to a physical calibration variable; and
vary the electrical resistance value of a memristor of a variable resistor arrangement until the measured value is in a tolerance range by a predetermined value in order to calibrate the measurement bridge circuit,
wherein the first branch includes the first resistor connected in series with an invariable resistor,
wherein a first tap point of the measurement bridge circuit is located between the first resistor and the invariable resistor,
wherein the second branch includes the second resistor connected in series with the variable resistor arrangement,
wherein the variable resistor arrangement includes a first component with an invariable electrical resistance value and the memristor,
wherein the memristor has a variable electrical resistance value and is connected in parallel with the first component and configured to vary a total electrical resistance value of the variable resistor arrangement,
wherein a second tap point of the measurement bridge circuit is located between the second resistor and the variable resistor arrangement, and
wherein the first branch and the second branch are connected in parallel and the measuring instrument is configured to be arranged between the first tap point and the second tap point.

8. The control device according claim 7, wherein the control device is configured to run a computer program product that includes program code.

* * * * *